(12) United States Patent
Yokoi (10) Patent No.: US 11,338,568 B2
(45) Date of Patent: May 24, 2022

(54) STORAGE DEVICE AND PRINTING SYSTEM

(71) Applicant: FUJI CORPORATION, Chiryu (JP)

(72) Inventor: Yoshimune Yokoi, Kiyosu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/057,471

(22) PCT Filed: May 25, 2018

(86) PCT No.: PCT/JP2018/020138
§ 371 (c)(1),
(2) Date: Nov. 20, 2020

(87) PCT Pub. No.: WO2019/225002
PCT Pub. Date: Nov. 28, 2019

(65) Prior Publication Data
US 2021/0197545 A1 Jul. 1, 2021

(51) Int. Cl.
| | | |
|---|---|---|
| *B41F 15/12* | (2006.01) |
| *B41F 15/08* | (2006.01) |
| *B41F 15/26* | (2006.01) |
| *H05K 3/12* | (2006.01) |
| *B41F 15/14* | (2006.01) |
| *B41F 15/36* | (2006.01) |

(52) U.S. Cl.
CPC ...... *B41F 15/0836* (2013.01); *B41F 15/0881* (2013.01); *B41F 15/12* (2013.01); *B41F 15/14* (2013.01); *B41F 15/26* (2013.01); *B41F 15/36* (2013.01); *H05K 3/1225* (2013.01)

(58) Field of Classification Search
CPC .......... B41F 15/08; B41F 15/12; B41F 15/14; B41F 15/26; B41F 15/36; H05K 3/1225
See application file for complete search history.

(56) References Cited

FOREIGN PATENT DOCUMENTS

| | | |
|---|---|---|
| CN | 203199524 U | 9/2013 |
| CN | 104309150 A | 1/2015 |
| JP | 4-107146 A | 4/1992 |

(Continued)

OTHER PUBLICATIONS

International Search Report dated Jul. 17, 2018 in PCT/JP2018/020138 filed on May 25, 2018.

*Primary Examiner* — Leslie J Evanisko
(74) *Attorney, Agent, or Firm* — Oblon, McClelland, Maier & Neustadt, L.L.P.

(57) ABSTRACT

A storage device is used in a printing device includes a storage section having a transfer stage for loading and unloading the exchange target object to and from the printing section, the storage section being configured to accommodate multiple placement sections, each for placing the exchange target object, and to store the exchange target object, a placement section moving section configured to move any one of the placement sections to the transfer stage, and a target object moving section disposed on the transfer stage, the target object moving section being configured to move between a retracted position allowing the placement section to pass and an abutting position abutting against the exchange target object on the placement section and to move the exchange target object in a loading/unloading direction while abutting against the exchange target object at the abutting position.

10 Claims, 9 Drawing Sheets

(56) References Cited

FOREIGN PATENT DOCUMENTS

| | | | |
|---|---|---|---|
| JP | 5-299812 A | 11/1993 | |
| JP | 8-39786 A | 2/1996 | |
| JP | 2012-200679 A | 10/2012 | |
| JP | 2015-233080 A | 12/2015 | |
| KR | 1999-004798 A | 1/1999 | |
| KR | 10-0463382 B1 | 9/2005 | |
| KR | 10-2013-0129123 A | 11/2013 | |
| WO | WO-2018105016 A1 * | 6/2018 | ............. B41F 35/00 |

* cited by examiner

STORAGE DEVICE AND PRINTING SYSTEM

TECHNICAL FIELD

The present specification discloses a storage device and a printing system.

BACKGROUND ART

Conventionally, for example, in a printing device that performs a viscous fluid printing process on a printing target, such as a board, using a screen mask, a printing device that performs automatic exchange of the screen mask has been known. For example, Patent Literature 1 discloses a printing device including a rod that protrudes downward and a slider that causes a screen mask to slide by moving the rod to put a main body frame in and out.

PATENT LITERATURE

Patent Literature 1: JP-A-H04-107146

BRIEF SUMMARY

Technical Problem

However, although multiple storing shelves for placing screen masks are provided in the printing device described above, the configuration is complicated since each storing shelf includes a belt conveyor for putting the screen mask in and out.

The present disclosure has been made in view of such problems, and a main object thereof is to provide a storage device and a printing system, which can simplify a configuration for loading and unloading an exchange target object to be stocked for a printing device use.

Solution to Problem

The storage device and the printing system, which are disclosed in the present specification, adopt the following means in order to achieve the main object described above.

A storage device of the present disclosure is a storage device used in a printing device including a printing section configured to perform a viscous fluid printing process on a printing target using an exchange target object including a screen mask; the storage device includes a storage section having a transfer stage for loading and unloading the exchange target object to and from the printing section, the storage section being configured to accommodate multiple placement sections for placing the exchange target object, and to store the exchange target object, a placement section moving section configured to move any one of the placement sections to the transfer stage, and a target object moving section disposed on the transfer stage, the target object moving section being configured to move between a retracted position allowing the placement section to pass and an abutting position abutting against the exchange target object on the placement section and to move the exchange target object in a loading/unloading direction while abutting against the exchange target object at the abutting position.

In the storage device, the target object moving section is disposed on the transfer stage for loading and unloading the exchange target object to and from the printing section, retracts to the retracted position to move any of the placement sections to the transfer stage, and moves to the abutting position to abut against the exchange target object such that the exchange target object is moved in the loading/unloading direction. In this manner, in the storage device, since it is not necessary to provide the target object moving section in all of the placement sections, a configuration for loading and unloading the exchange target object to be used in the printing device and stocking the exchange target object can be further simplified. Herein, examples of the "exchange target object" include a cartridge accommodating viscous fluid, a squeegee, a cleaning member used in cleaning the screen mask, and a support member that fixes the printing target, in addition to the screen mask. Examples of the "printing target" include a board, on which a component is mounted, and a three-dimensional object. In addition, examples of the "viscous fluid" include solder paste, conductive paste, and adhesive. In the storage device, the target object moving section may be disposed only on the transfer stage. The "transfer stage" may be only a single stage or multiple stages, but the single stage is preferable since the configuration can be further simplified. In the storage device, the configuration can be simplified most. In addition, in the storage device, the placement section moving section may move the placement section in a vertical direction, and the target object moving section may move the exchange target object in a horizontal direction, which is the loading/unloading direction.

DESCRIPTION OF EMBODIMENTS

Figure 1:
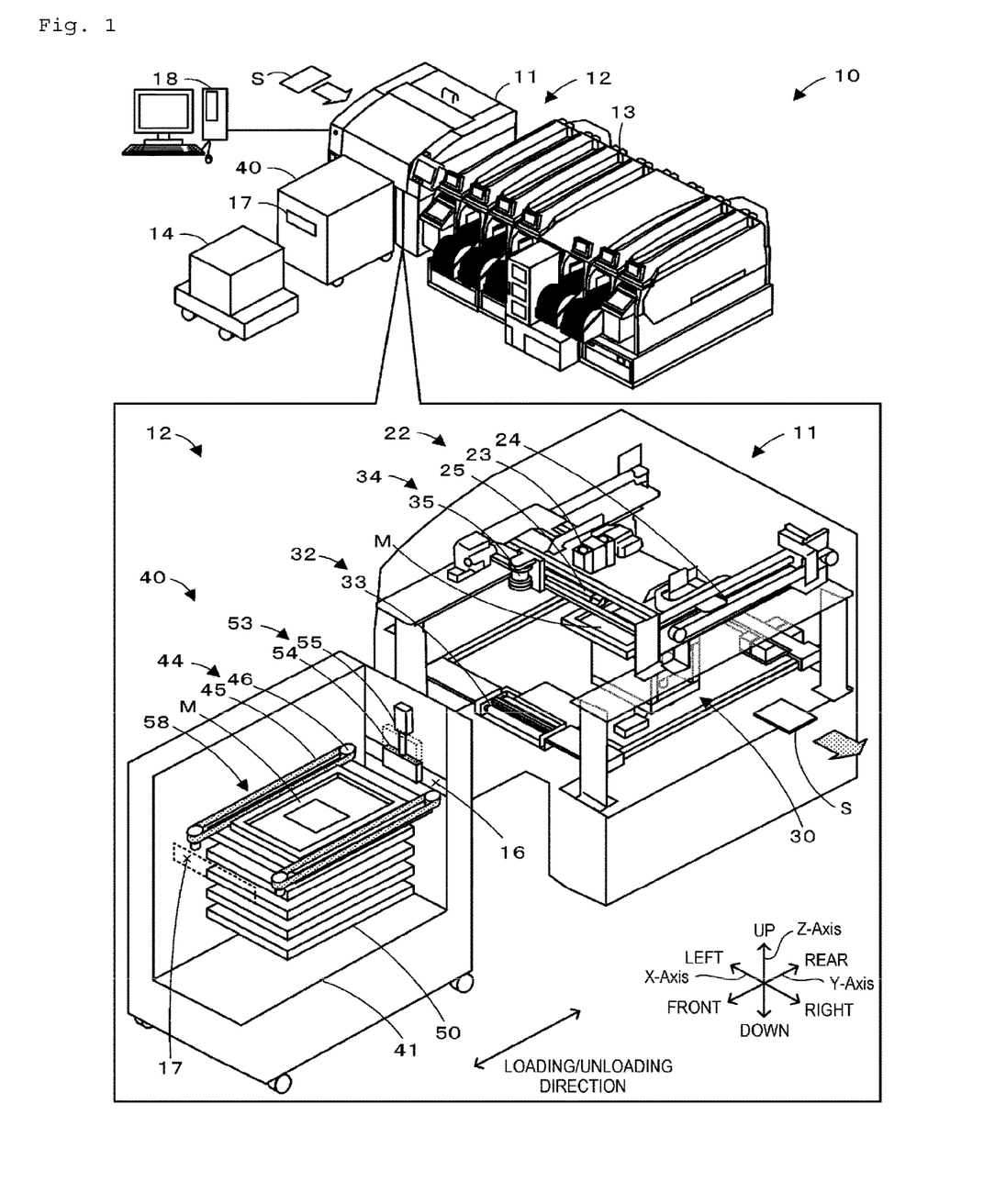
FIG. 1 A schematic explanatory view showing an example of mounting system 10 including printing device 11.
Figure 2:
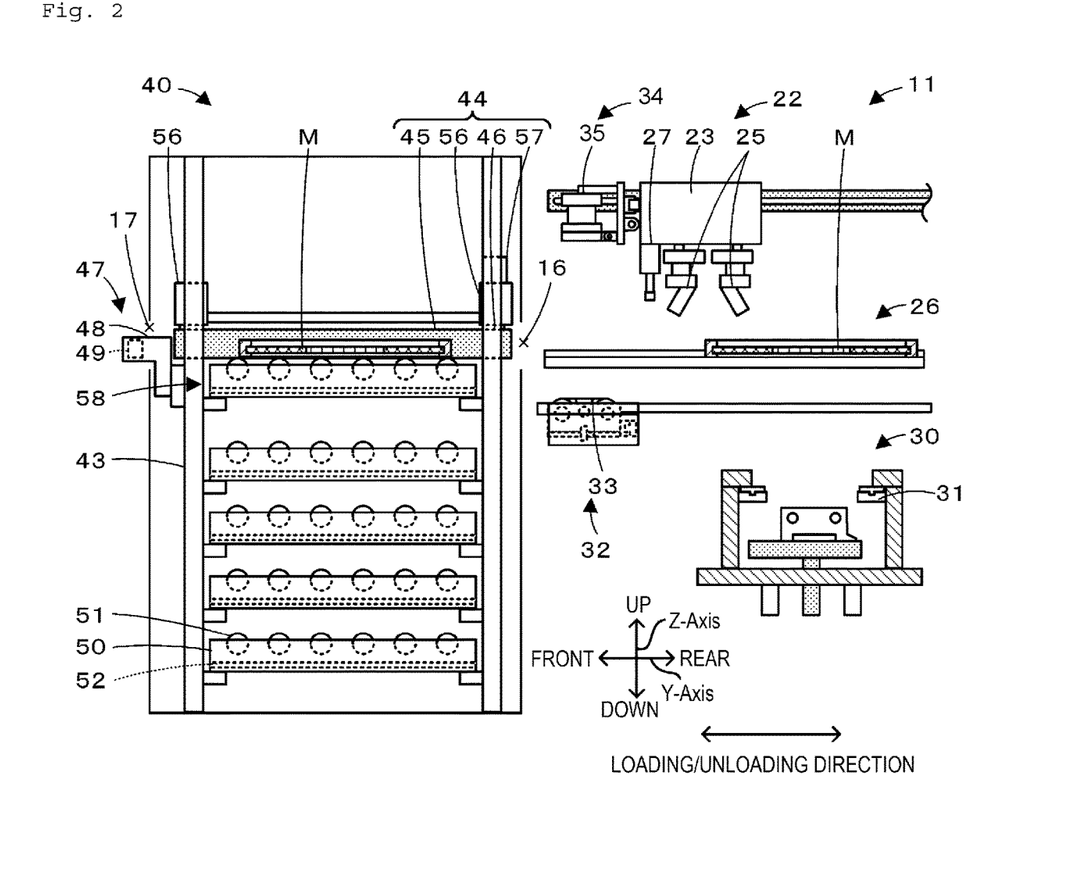
FIG. 2 A schematic explanatory view of storage device 40 and printing device 11.
Figure 3A:
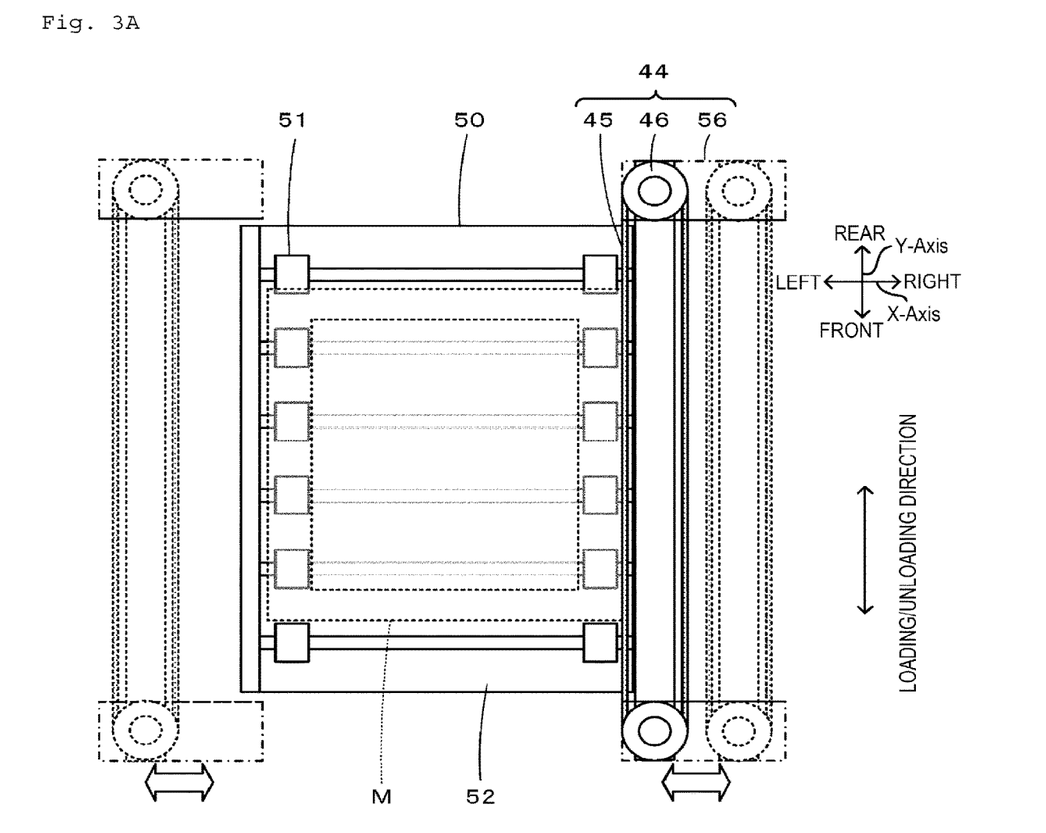
FIG. 3 An explanatory view of target object moving section 44 and placement section 50.
Figure 3B:
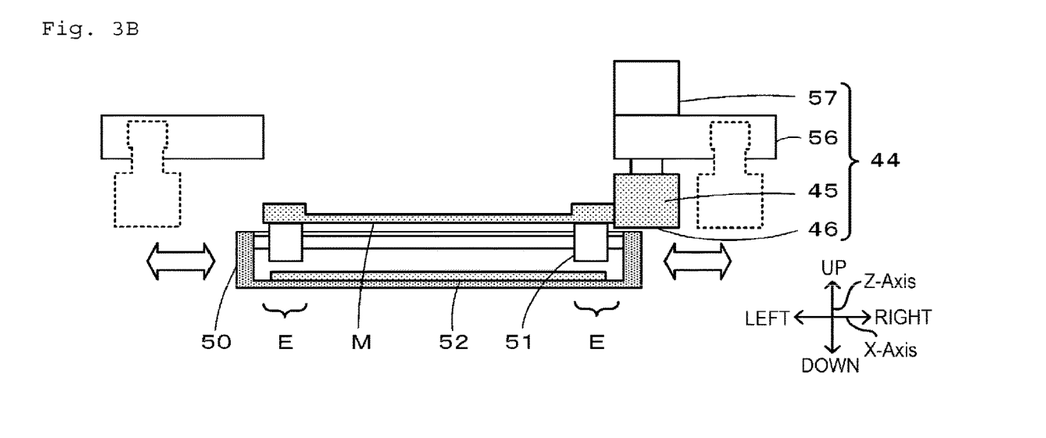
Figure 4:
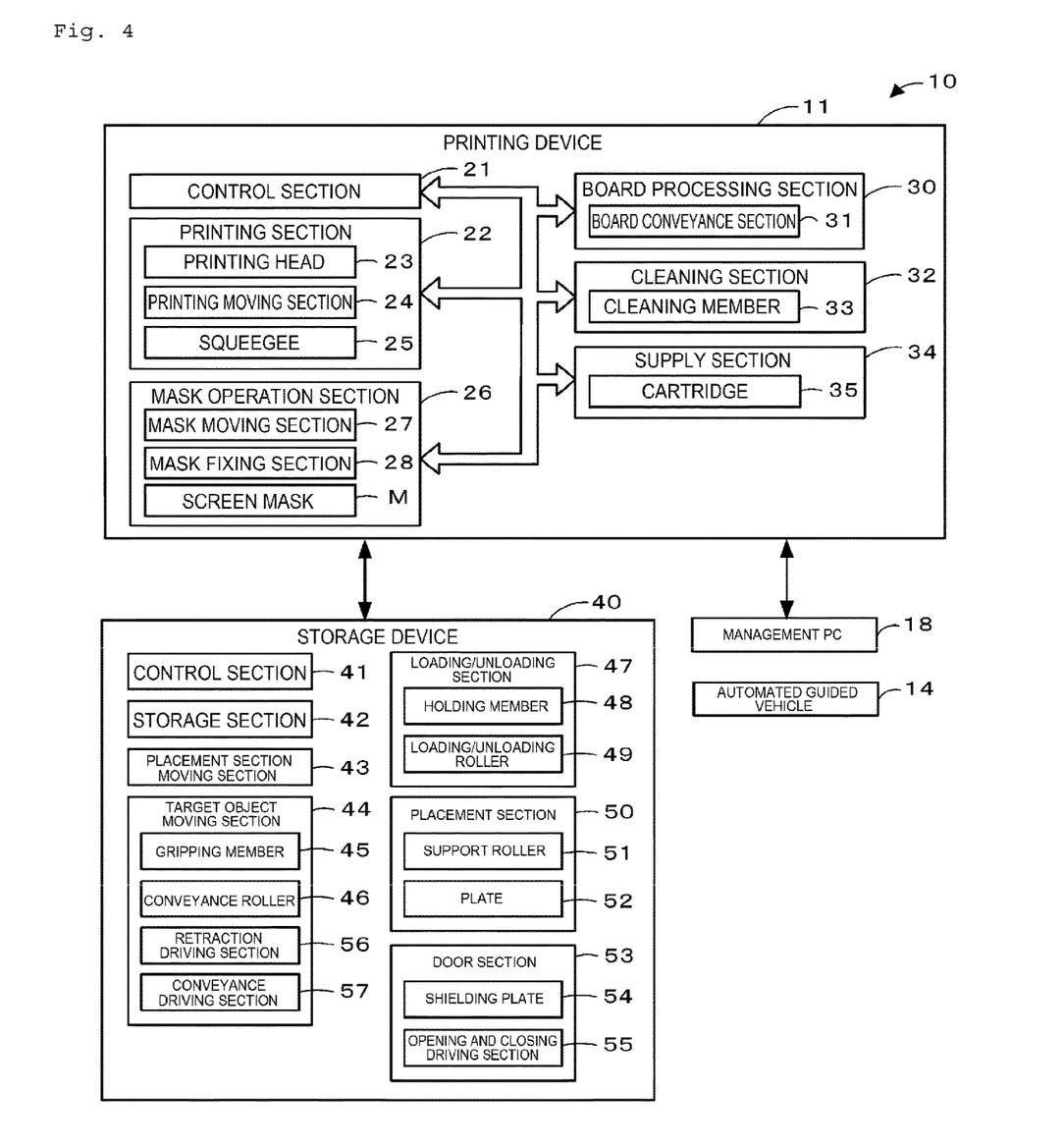
FIG. 4 A block diagram showing an electrical connection relationship of mounting system 10.

The present embodiment will be described below with reference to the drawings. FIG. 1 is a schematic explanatory view showing an example of mounting system 10 including printing device 11 which is an example of the present disclosure. FIG. 2 is a schematic explanatory view of storage device 40 and printing device 11. FIG. 3 is an explanatory view of target object moving section 44 and placement section 50; FIG. 3A is a plan view and FIG. 3B is a front view. FIG. 4 is a block diagram showing an electrical connection relationship of mounting system 10. Mounting system 10 is, for example, a system for mounting a component on board S. Mounting system 10 includes printing system 12 having printing device 11 and storage device 40, mounting device 13, automated guided vehicle 14, management computer (PC) 18, and storage device 40. Mounting system 10 is configured as a mounting line in which multiple mounting devices 13, mounting components on board S, are arranged on a downward stream side of printing device 11. In the present embodiment, a rightward-leftward direction (X-axis), a front-rear direction (Y-axis), and an up-down direction (Z-axis) are as shown in FIGS. 1 to 3 and FIGS. 5 to 10.

Mounting device 13 is a device that mounts a component on board S on which viscous fluid such as solder paste is printed by printing device 11. Automated guided vehicle 14 moves between a stocker where members related to a mounting process are stocked and the mounting line, and automatically conveys, for example, a member such as screen mask M. Storage device 40 is connected to printing device 11, and automated guided vehicle 14 temporarily stores the conveyed member in storage device 40. Management PC 18 is a device that manages information of each device of mounting system 10. Management PC 18 manages the progress state of each device of the mounting line, members conveyed by automated guided vehicle 14, and a current position. Each device of mounting system 10 exchanges information with management PC 18 and acquires information such as the progress states of other devices.

As shown in FIGS. 1 to 4, printing device 11 is a device that applies (prints) the solder, which is viscous fluid, to board S as a printing target disposed below, via a pattern hole, which is performed by pushing solder on screen mask M into the pattern hole formed in screen mask M with the use of squeegee 25. Examples of the "printing target" include board S, on which a component is mounted, and a three-dimensional object. Examples of the "viscous fluid" include solder paste, conductive paste, and adhesive. Herein, board S and solder will be described below as examples. Printing device 11 includes control section 21 (see FIG. 4), printing section 22, mask operation section 26, board processing section 30, cleaning section 32, and supply section 34. Control section 21 is configured as a microprocessor centered on a CPU, and controls entire printing device 11.

Printing section 22 is a unit that is disposed at an upper stage of printing device 11 and performs a viscous fluid printing process on board S using screen mask M. Printing section 22 includes printing head 23, printing moving section 24, a squeegee lifting and lowering section, and squeegee 25, as shown in FIGS. 1 and 4. Printing moving section 24 moves printing head 23 in a predetermined printing direction (herein, the front-rear direction), and includes a guide formed in the front-rear direction, a slider that moves along the guide, and a motor that drives the slider. Squeegee 25 is disposed on a lower surface side of printing head 23 and is lifted and lowered by the squeegee lifting and lowering section. Printing section 22 has two squeegees 25 each used in the front-rear direction. Mask operation section 26 is a unit that is disposed between printing section 22 and board processing section 30 in the up-down direction and fixes and holds screen mask M, as shown in FIG. 2. As shown in FIG. 4, mask operation section 26 includes mask moving section 27 and mask fixing section 28. Mask moving section 27 is a conveyance rod provided at printing head 23 and is lowered to a position abutting against screen mask M by an air cylinder (not shown). Mask fixing section 28 positions screen mask M and supports and fixes screen mask M in a horizontal posture. Screen mask M is pushed by mask moving section 27 so as to be moved back and forth along the guide of mask operation section 26, and is fixed by mask fixing section 28. As shown in FIG. 2, board processing section 30 is a unit that is disposed below mask operation section 26, loads board S, positions and supports loaded board S, and comes into contact with or separates away from screen mask M. Board processing section 30 includes board conveyance section 31 that conveys board S in the rightward-leftward direction, a board support member that supports board S from below, and a board lifting and lowering section that lifts and lowers entire board processing section 30 and the board support member. As shown in FIG. 2, cleaning section 32 is a unit that is disposed between mask operation section 26 and board processing section 30 in the up-down direction and performs a cleaning process of cleaning a bottom surface of screen mask M. Cleaning section 32 has cleaning member 33, and cleaning member 33 cleans screen mask M. Supply section 34 is a unit that supplies solder accommodated in cartridge 35 onto screen mask M. Supply section 34 is disposed in front of printing head 23. Supply section 34 applies a pressure to cartridge 35 such that the solder is discharged from cartridge 35. Cleaning member 33 and cartridge 35 are consumables and are exchanged as necessary.

Storage device 40 is disposed in front of printing device 11. Storage device 40 stores an exchange target object to be used in printing device 11, including screen mask M, and loads and unloads the exchange target object to and from printing device 11 and automated guided vehicle 14. Herein, examples of the "exchange target object" include cartridge 35 accommodating viscous fluid, squeegee 25, cleaning member 33 used in cleaning screen mask M, and the support member (board support member) that fixes a printing target, in addition to screen mask M. Herein, screen mask M will be mainly described.

Storage device 40 includes control section 41, storage section 42, placement section moving section 43, target object moving section 44, loading/unloading section 47, placement section 50, and door section 53. Placement section 50 is a shelf for placing screen mask M. As shown in FIG. 3, placement section 50 has support roller 51 and plate 52. Support rollers 51 support screen mask M without being connected to a driving section, and are disposed at two positions near end portions of a support shaft rotatably supported by side walls. Support rollers 51 are disposed at multiple locations (six locations) in placement section 50. Support rollers 51 are provided in regions other than a printing region of screen mask M to support at least end portion regions E (frame portions) of screen mask M (see FIG. 3B). Plate 52 is a plate-like member disposed below the printing region of screen mask M placed on support rollers 51. Plate 52 is detachably fixed to a housing of placement section 50. In storage device 40, multiple (for example, five) placement sections 50 are accommodated in storage section 42.

Control section 41 is configured as a microprocessor centered on a CPU, and controls entire storage device 40, such as driving of each driving section (a motor or an air cylinder). Storage section 42 is formed inside a housing of storage device 40, is provided with transfer stage 58 for loading and unloading screen mask M to and from printing section 22, accommodates multiple placement sections 50, and stores screen mask M. Opening section 16, through which screen mask M passes, is formed in a printing device 11 side of transfer stage 58 of storage section 42. In addition, loading/unloading port 17, through which screen mask M passes, is formed at transfer stage 58 of storage section 42, being at a side of an automated guided vehicle 14 (see FIGS. 1 and 2). Placement section moving section 43 performs a process of moving any one of placement sections 50 to transfer stage 58. As shown in FIG. 2, placement section moving section 43 has multiple support sections that support placement sections 50 at predetermined intervals, and lifts and lowers placement sections 50 in a vertical direction (Z-axis direction) with a linear motion driving section formed in the up-down direction.

Target object moving section 44 is a unit that abuts against screen mask M and moves screen mask M in a loading/unloading direction (a Y-axis direction, or the front-rear direction). As shown in FIG. 3, target object moving section 44, is disposed on transfer stage 58, and moves between a retracted position allowing placement section 50 to pass (a dotted line in the drawing) and an abutting position abutting against screen mask M on placement section 50 (a solid line in the drawing). In FIG. 3, target object moving section 44 at the left abutting position is omitted. When placement section 50 is lifted and lowered, target object moving section 44 moves to the retracted position in order to avoid contact with placement section 50. Target object moving section 44 includes gripping member 45, conveyance roller 46, a driven roller, retraction driving section 56, and conveyance driving section 57. Target object moving section 44 has at least one pair of gripping members 45 and at least one pair of conveyance rollers 46 on the right and left. Only a pair of target object moving sections 44 is disposed on transfer stage 58. Gripping member 45 is a member that moves between the retracted position and the abutting position and grips an end portion of screen mask M. Gripping member 45 is disposed on a side surface side of screen mask M. Gripping member 45 is a belt that is wound around conveyance roller 46 and the driven roller to be driven by conveyance roller 46, and directly comes into contact with screen mask M. That is, target object moving sections 44 are configured as a pair of right and left belt conveyors. An abutting surface of the belt abutting against screen mask M is disposed along the vertical direction. The belt abuts against a side surface of a frame body on an outer periphery of screen mask M. Conveyance roller 46 moves between a retraction position and the abutting position together with gripping member 45, and moves screen mask M in the loading/unloading direction by moving gripping member 45. Although not shown, one or more support rollers that support gripping member 45 may be provided between conveyance roller 46 and the driven roller. Retraction driving section 56 moves gripping member 45 and conveyance roller 46 between the retracted position and the abutting position. Retraction driving section 56 is connected to a central shaft of conveyance roller 46, and moves gripping member 45 in a horizontal direction (X-axis direction) orthogonal to the loading/unloading direction via the central shaft. Retraction driving section 56 is fixed to the housing of storage device 40, and supports gripping member 45 and conveyance roller 46 by hanging them downward (see FIGS. 2 and 3B). Retraction driving section 56 may be an air cylinder, or may be a linear motor. Conveyance driving section 57 is a motor that rotatably drives conveyance roller 46, and is disposed above conveyance roller 46. Retraction driving section 56 and conveyance driving section 57 are fixed at positions deviated from a lifting and lowering region of placement section 50 so as not to interfere the lifting and lowering of placement section 50 (see FIG. 3A).

Loading/unloading section 47 is a unit that loads and unloads an exchange target object, such as screen mask M, to and from automated guided vehicle 14. As shown in FIG. 2, loading/unloading section 47 is stored in storage section 42 and is disposed on transfer stage 58. As protruded outward from storage section 42, loading/unloading section 47 performs a process of pulling screen mask M into storage section 42 or pushing screen mask M out of storage section 42. Automated guided vehicle 14 does not include a device that pushes screen mask M to the outside in some cases. Screen mask M is exchanged by loading/unloading section 47, protruding outward, between storage device 40 and automated guided vehicle 14. Loading/unloading section 47 includes holding member 48, loading/unloading roller 49, a movement driving section, and a turn driving section. Holding member 48 is a member for holding an end portion of an exchange target object disposed outside storage device 40. Loading/unloading roller 49 moves together with holding member 48, and moves screen mask M in the loading/unloading direction while directly abutting against screen mask M. Loading/unloading roller 49 is disposed on a tip side of holding member 48. The movement driving section is a motor that rotatably drives loading/unloading roller 49, and is disposed at a tip of holding member 48 together with loading/unloading roller 49. The turn driving section is a rotary actuator that turns holding member 48 between a holding position and a releasing position. The turn driving section is connected to a turning shaft of holding member 48. Loading/unloading section 47 has at least one pair of holding members 48, at least one pair of loading/unloading rollers 49, at least one pair of the movement driving sections, and at least one pair of the turn driving sections, holds side surfaces of screen mask M from both sides, and then moves screen mask M. Since holding member 48 and the turn driving section avoid interfering with target object moving section 44, holding member 48 and the turn driving section are supported and fixed from below transfer stage 58.

Door section 53 is a shutter unit that restricts the movement of screen mask M to the outside. Door sections 53 are disposed at two locations in the vicinity of opening section 16 (see FIG. 1) and in the vicinity of loading/unloading port 17. Here, the illustration of door section 53 disposed at loading/unloading port 17 is omitted. As shown in FIGS. 1 and 4, door section 53 has shielding plate 54 and opening and closing driving section 55. Shielding plate 54 moves between a restricted position where the movement of screen mask M on transfer stage 58 in the loading/unloading direction is restricted (a solid line of FIG. 1) and an open position where the movement of screen mask M in the loading/unloading direction is allowed (a dotted line of FIG. 1). Shielding plate 54 of door section 53 moves in a direction (up-down direction) orthogonal to the loading/unloading direction in which screen mask M moves. Opening and closing driving section 55 is an actuator that moves shielding plate 54 between the restricted position and the open position. Placement section 50 has support roller 51 which rotates freely, and smooths the movement of screen mask M. Door section 53 is fixed at the restricted position except during loading and unloading screen mask M, and restricts the unintended movement of screen mask M to the outside.

Figure 5A:
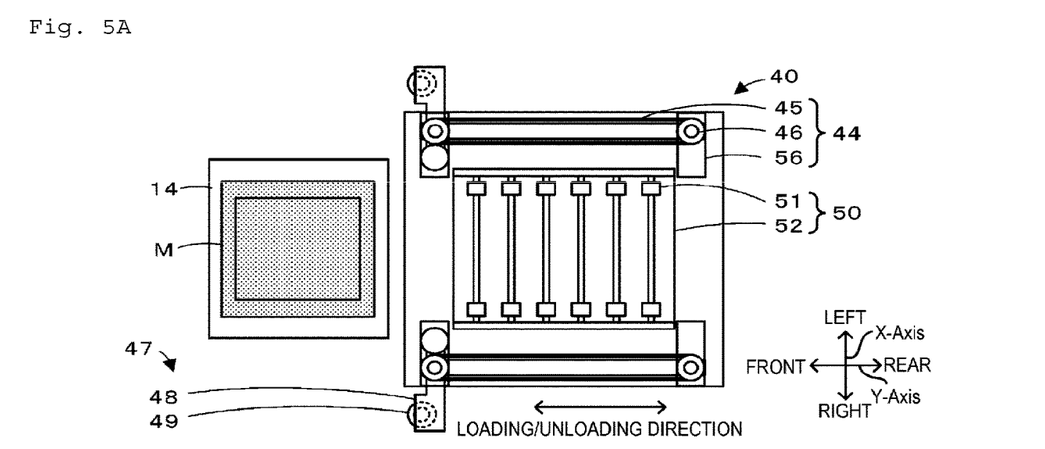
FIG. 5 An explanatory view showing a process of loading screen mask M to storage device 40.
Figure 5B:
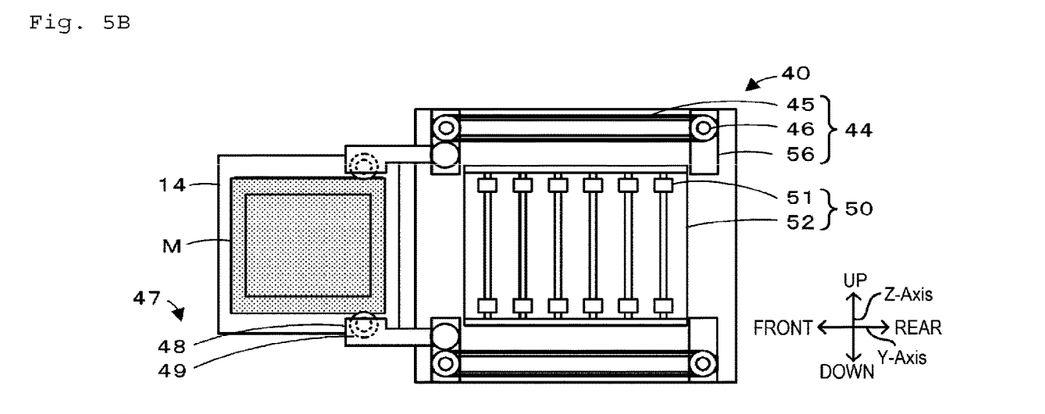
Figure 5C:
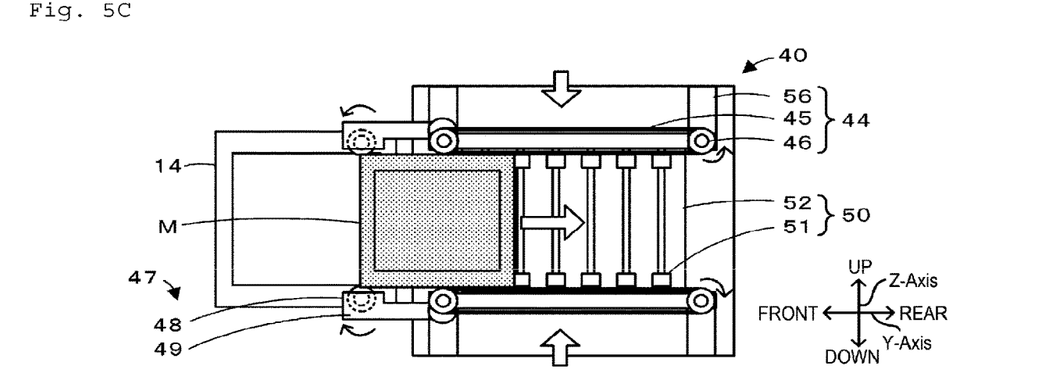

Next, an operation of storage device 40 configured as described above will be described. First, a process of loading screen mask M, which is an exchange target object, from automated guided vehicle 14 to storage device 40 will be described. FIG. 5 is an explanatory view showing a process of loading screen mask M to storage device 40; FIG. 5A is a view showing that loading/unloading section 47 is at the releasing position, FIG. 5B is a view showing that loading/unloading section 47 holds screen mask M, and FIG. 5C is a view showing that screen mask M is being loaded. Automated guided vehicle 14 has screen mask M placed at the height of transfer stage 58. First, control section 41 receives, from management PC 18, a loading command of screen mask M conveyed by automated guided vehicle 14. Control section 41 fixes loading/unloading section 47 at the releasing position while opening loading/unloading port 17 by moving shielding plate 54 of door section 53 to the open position (FIG. 5A). Automated guided vehicle 14 stops in front of storage device 40. Next, control section 41 drives the turn driving section to turn and move holding member 48 to the holding position, and causes holding member 48 to hold screen mask M (FIG. 5B). Next, control section 41 drives the movement driving section to rotate loading/unloading roller 49 which has abutted against the side surfaces of screen mask M, and moves screen mask M in the loading/unloading direction (FIG. 5C). When screen mask M enters storage section 42, control section 41 causes retraction driving section 56 to have gripping member 45 abut against the side surface of screen mask M, and causes conveyance driving section 57 to drive conveyance roller 46 such that screen mask M is moved to a central region of placement section 50. Then, control section 41 moves shielding plate 54 of door section 53 to the restricted position such that the movement of screen mask M to the outside is restricted. In this manner, storage device 40 can store screen mask M in storage section 42 using loading/unloading section 47.

Figure 6A:
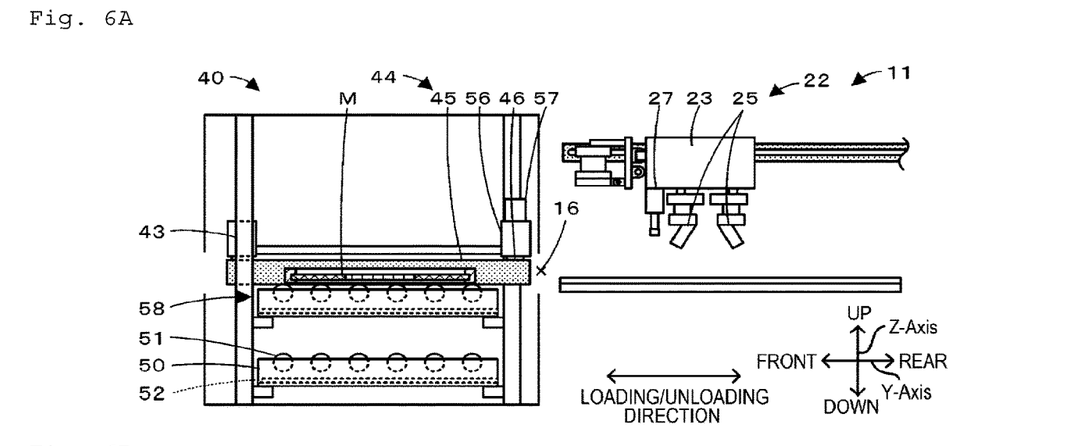
FIG. 6 An explanatory view showing a process of sending screen mask M out to printing device 11.
Figure 6B:
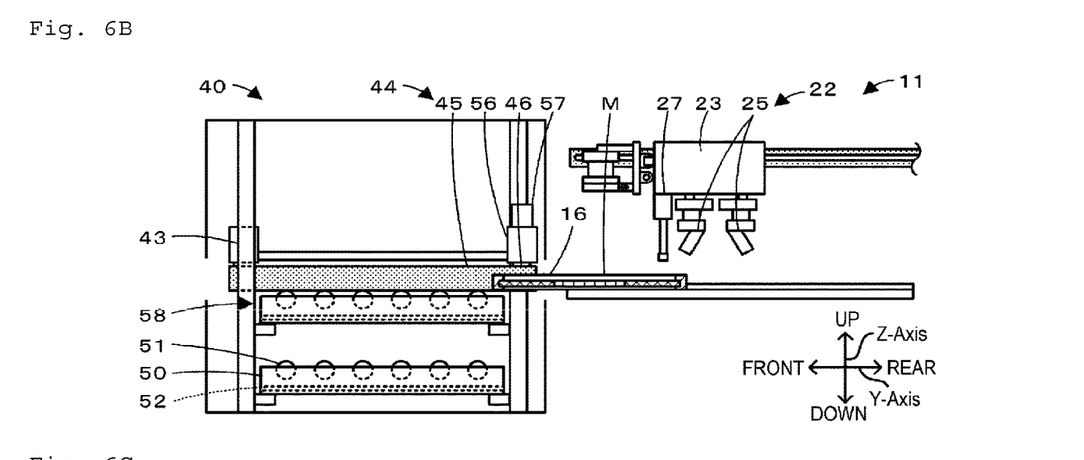
Figure 6C:
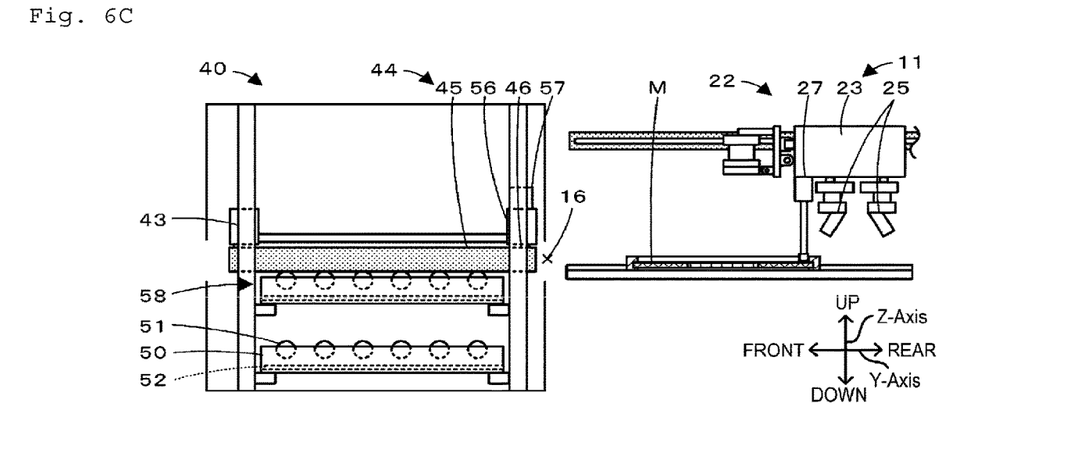

Next, a process of unloading screen mask M from storage device 40 to printing device 11 will be described. FIG. 6 is an explanatory view showing a process of sending screen mask M out to printing device 11; FIG. 6A is view of a preparation state, FIG. 6B is a view showing movement by target object moving section 44, and FIG. 6C is a view showing loading by mask moving section 27. Placement section 50 on transfer stage 58 and mask operation section 26 are at the same height, and screen mask M is moved horizontally. First, control section 41 and control section 21 receive, from management PC 18, a loading command of screen mask M to printing device 11. Control section 41 opens opening section 16 by moving shielding plate 54 of door section 53 to the open position. In addition, control section 41 causes gripping member 45 to grip the side surface of screen mask M by causing retraction driving section 56 to move gripping member 45 to the abutting position (FIG. 6A). Next, control section 41 drives conveyance driving section 57; conveyance roller 46 rotatably drives, causing gripping member 45 to move screen mask M in the loading/unloading direction (FIG. 6B). Control section 21 moves printing head 23 to a position where mask moving section 27 can move screen mask M. In addition, control section 21 lowers the conveyance rod of mask moving section 27. Next, when screen mask M is unloaded to the outside of storage section 42, control section 41 causes retraction driving section 56 to move gripping member 45 to the retracted position, and causes opening and closing driving section 55 to move shielding plate 54 to the restricted position. In addition, control section 21 causes the conveyance rod of mask moving section 27 to abut against the frame body of screen mask M, and causes screen mask M to move together with printing head 23 (FIG. 6C). In this manner, storage device 40 can push out screen mask M to printing device 11 using target object moving section 44.

Figure 7A:
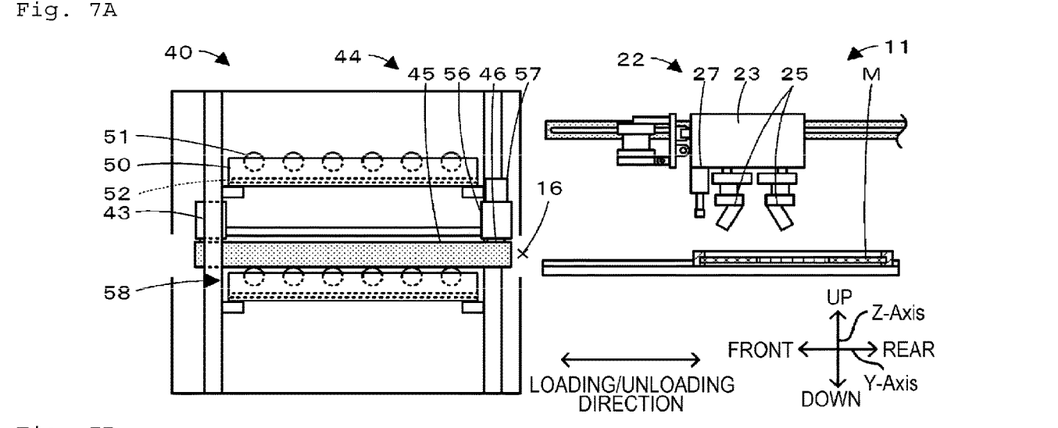
FIG. 7 An explanatory view showing a process of unloading screen mask M from printing device 11.
Figure 7B:
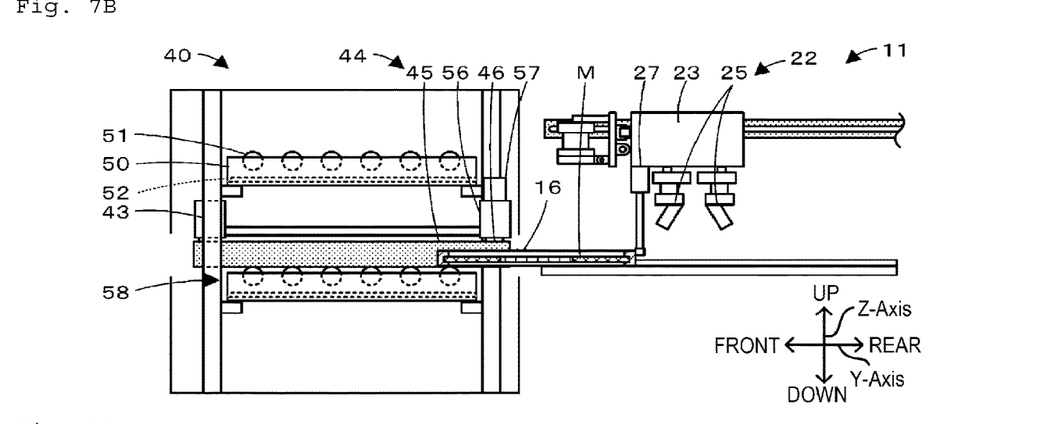
Figure 7C:
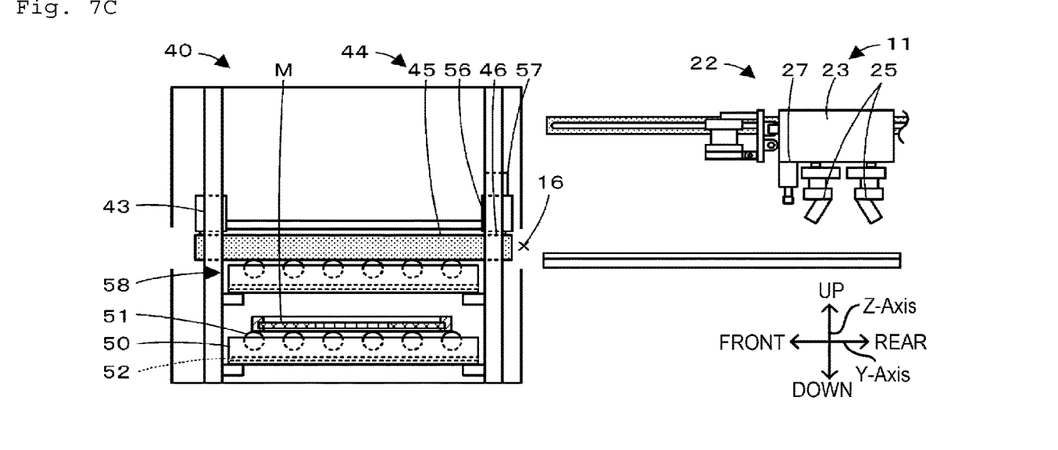

Next, a process of unloading screen mask M from printing device 11 to storage device 40 will be described. FIG. 7 is an explanatory view showing a process of unloading screen mask M from printing device 11; FIG. 7A is a view of a preparation state, FIG. 7B is a view showing movement by mask moving section 27, and FIG. 7C is a view showing loading by target object moving section 44. First, control section 41 and control section 21 receive, from management PC 18, a screen mask M unloading command to storage device 40. Control section 41 opens opening section 16 by moving shielding plate 54 of door section 53 to the open position (FIG. 7A). In addition, control section 21 moves printing head 23 to a position for moving screen mask M, and lowers the conveyance rod to abut against the frame body of screen mask M. Next, control section 21 moves printing head 23 to push the frame body of screen mask M, and moves screen mask M in the loading/unloading direction (FIG. 7B). Next, control section 41 causes gripping member 45 to grip the side surface of screen mask M by causing retraction driving section 56 to move gripping member 45 to the abutting position. Next, control section 41 drives conveyance driving section 57; conveyance roller 46 rotatably drives, causing gripping member 45 to move screen mask M in the loading/unloading direction. Next, when screen mask M is accommodated inside storage section 42, control section 41 causes retraction driving section 56 to move gripping member 45 to the retracted position, and causes opening and closing driving section 55 to move shielding plate 54 to the restricted position. In addition, control section 41 may cause placement section moving section 43 to move placement section 50, on which screen mask M after use is placed, to a stage different from transfer stage 58 (FIG. 7C). In this manner, storage device 40 can collect screen mask M using target object moving section 44.

Herein, a correspondence relationship between components of the present embodiment and components of the present disclosure will be clarified. Storage section 42 of the present embodiment corresponds to a storage section, placement section moving section 43 corresponds to a placement section moving section, target object moving section 44 corresponds to a target object moving section, loading/unloading section 47 corresponds to a loading/unloading section, and door section 53 corresponds to a door section.

In storage device 40 of the present embodiment described above, target object moving section 44 is disposed on transfer stage 58 for loading and unloading screen mask M, which is an exchange target object, to and from printing section 22, retracts to the retracted position to move any placement section 50 to transfer stage 58, and moves to the abutting position to abut against the exchange target object such that the exchange target object is moved in the loading/unloading direction. In this manner, in storage device 40, since it is not necessary to provide target object moving section 44 in all of placement sections 50, a configuration for loading and unloading the exchange target object to be used in printing device 11 and stocking the exchange target object can be further simplified. In addition, target object moving section 44 has at least one pair of gripping members 45 for moving between the retracted position and the abutting position and gripping an end portion of the exchange target object and at least one pair of conveyance rollers 46 that moves together with gripping member 45 and moves the exchange target object in the loading/unloading direction. In storage device 40, gripping member 45 grips the exchange target object, and conveyance roller 46 moves the exchange target object in the loading/unloading direction. Further, gripping member 45 is a belt that is wound around conveyance roller 46 to be driven by conveyance roller 46 and abuts against the exchange target object. In storage device 40, the exchange target object can be more reliably gripped and conveyed using the belt conveyor. Further, as being disposed on a side surface side of the exchange target object, gripping member 45 grips the exchange target object from a side surface thereof, and thereby the exchange target object can be moved in the loading/unloading direction. In addition, in storage device 40, since target object moving section 44 retracts to the side surface side, that is, in the horizontal direction, the movement of placement section 50 is unlikely to be hindered when placement section 50 moves in the vertical direction.

In addition, in placement section 50, multiple support rollers 51 that support at least an end portion of an exchange target object are disposed. In storage device 40, since the exchange target object is supported by support rollers 51, the exchange target object can be more smoothly moved. In addition, since support rollers 51 having no driving section are disposed in placement section 50, the configuration can be further simplified. Further, support rollers 51 of placement section 50 are provided in a region (a region of the frame body) other than the printing region of screen mask M. Viscous fluid is adhered to a bottom surface of screen mask M in some cases. Since support rollers 51 are not disposed in the printing region, such contamination on support rollers 51 can be suppressed. In addition, placement section 50 includes detachable plate 52 below the printing region of placed screen mask M. Since, even when the viscous fluid falls from screen mask M, plate 52 can receive the viscous fluid, plate 52 is detached and cleaning is carried out in storage device 40.

In addition, storage device 40 includes door section 53 that moves between the restricted position where the movement of an exchange target object on transfer stage 58 in the loading/unloading direction is restricted and the open position where the movement of the exchange target object in the loading/unloading direction is allowed. In storage device 40, door section 53 can prevent the exchange target object from unintentionally moving out of the device. Door section 53 moves in a direction orthogonal to a direction in which target object moving section 44 moves. For example, target object moving section 44 moves in the horizontal direction, and door section 53 moves in the vertical direction. In storage device 40, it is preferable that the movement of target object moving section 44 and the movement of door section 53 are unlikely to interfere with each other.

In addition, storage device 40 includes loading/unloading section 47, being stored in storage section 42 and disposed on transfer stage 58, which pulls an exchange target object into storage section 42 or pushes the exchange target object out of storage section 42 by protruding outward from storage section 42. In storage device 40, loading/unloading section 47 protruding outward makes it easy to pull the exchange target object into storage section 42, and makes it easy to push the exchange target object out of storage section 42. In addition, loading/unloading section 47 has at least one pair of holding members 48 for holding an end portion of the exchange target object disposed outside storage device 40 and at least one pair of loading/unloading rollers 49 that moves together with holding member 48 and moves the exchange target object in the loading/unloading direction. In storage device 40, the exchange target object can be held by holding member 48, and the exchange target object can be pulled into storage section 42 or can be pushed from storage section 42 by loading/unloading roller 49.

In addition, printing system 12 includes storage device 40 described above and the printing device including printing section 22 that performs a viscous fluid printing process on board S, which is a printing target, using an exchange target object pushed from storage device 40. Similar to storage device 40 described above, printing system 12 can further simplify a configuration for loading and unloading the exchange target object to be used in printing device 11 and stocking the exchange target object.

The storage device and printing system of the present disclosure are not limited to the embodiment described above, and it is evident that the storage device and the printing system can be implemented in various forms without departing from the technical scope of the present disclosure.

For example, storage device 40 is described as a device including only one transfer stage 58 in the embodiment described above; however, without being particularly limited to this, storage device 40 may have two or more stages. In this case, if the number of transfer stages 58 is smaller than the number of placement sections 50, the number of target object moving sections 44 can be reduced, and thus the configuration can be further simplified. Target object moving sections 44 need only be disposed on transfer stage 58, or may be on another stage if the configuration thereof is simplified.

Figure 8:
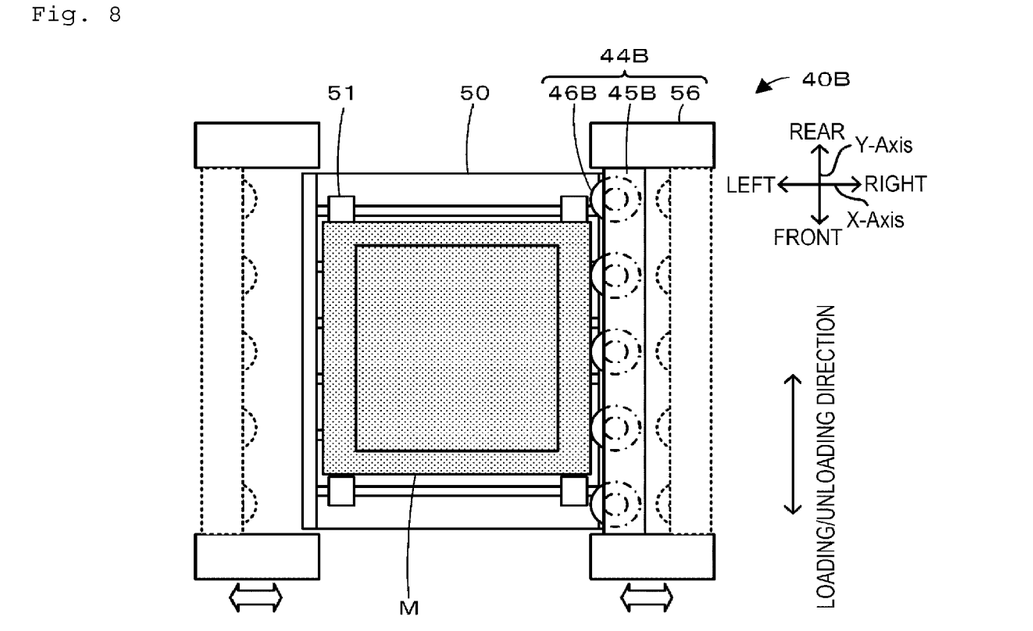
FIG. 8 An explanatory view showing an example of another target object moving section 44B.

Target object moving section 44 that is a belt conveyor having gripping member 45, which is a belt, and conveyance roller 46, which drives the belt, is described in the embodiment described above; however, the configuration is not particularly limited to this. FIG. 8 is an explanatory view showing an example of another target object moving section 44B. In target object moving section 44B, gripping member 45B is a support member that supports conveyance roller 46B; conveyance roller 46B is disposed at gripping member 45B and moves an exchange target object in the loading/unloading direction while directly abutting against the exchange target object. In storage device 40B, gripping member 45B, which is the support member, moves conveyance roller 46B between the retracted position and the abutting position; conveyance roller 46B can move the exchange target object while directly abutting against the exchange target object.

Figure 9:
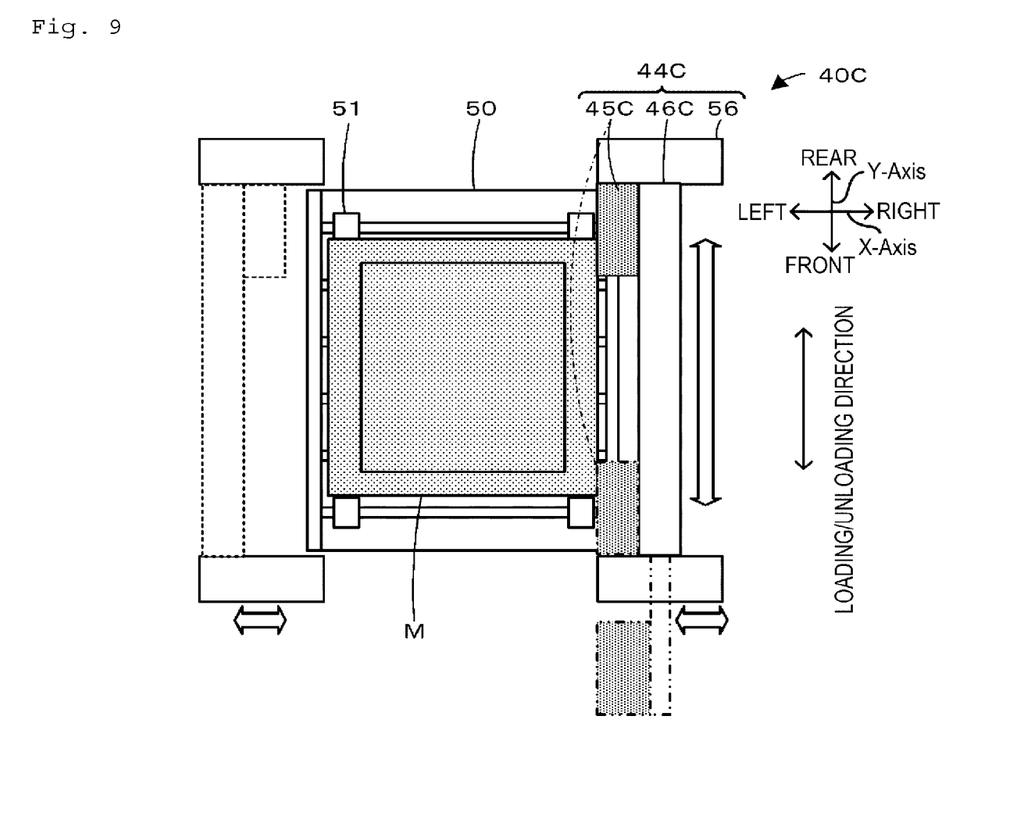
FIG. 9 An explanatory view showing an example of still another target object moving section 44C.

Alternatively, the target object moving section that moves an exchange target object is not limited to a section having gripping member 45 and conveyance roller 46. FIG. 9 is an explanatory view showing an example of still another target object moving section 44C. Target object moving section 44C has at least one pair of gripping members 45C that moves between the retracted position and the abutting position and grips an end portion of the exchange target object and at least one pair of linear motion driving sections 46C that moves the exchange target object in the loading/unloading direction together with gripping member 45C. In storage device 40C, gripping member 45C can grip the exchange target object, and linear motion driving section 46C can move the exchange target object in the loading/unloading direction. For example, linear motion driving section 46C may be an air cylinder, or may be a linear motor. In addition, linear motion driving section 46C may be capable of moving gripping member 45C supported by an extending support member to the outside of storage section 42 (see a two-dot chain line of FIG. 9). In storage device 40C, target object moving section 44C can also serve as loading/unloading section 47. Only one pair of gripping members 45C is included in FIG. 9, but two or more pairs may be included.

Figure 10:
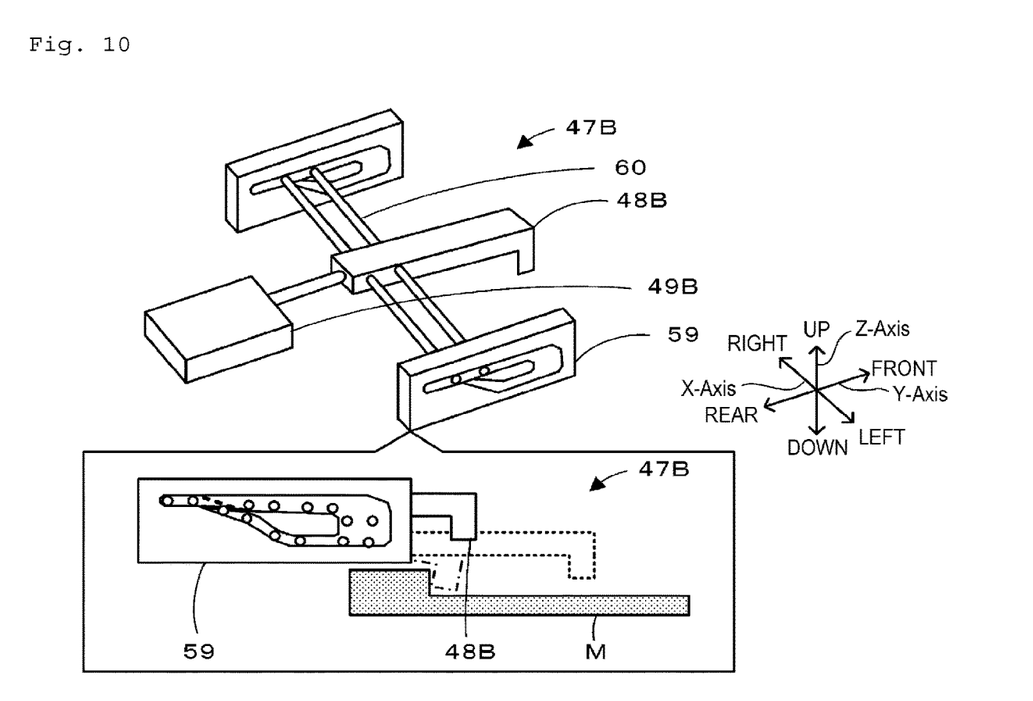
FIG. 10 An explanatory view showing an example of another loading/unloading section 47B.

Storage device 40 includes loading/unloading section 47 including holding member 48 and loading/unloading roller 49 in the embodiment described above; however, the configuration is not particularly limited to this if a section protrudes to the outside and exchanges an exchange target object. FIG. 10 is an explanatory view showing an example of another loading/unloading section 47B. Loading/unloading section 47B has hooking member 48B that is supported by shaft 60, is disposed outside storage device 40, and hook an end portion of the exchange target object to move the exchange target object in the loading/unloading direction, guide member 59 that guides hooking member 48B between a protruding position protruding to the outside of storage device 40 and a retreated position inside storage device 40, and driving section 49B that moves hooking member 48B along a guide of guide member 59. Shaft 60 is inserted into a guide hole of guide member 59 and moves along the guide hole. The guide hole is provided with a restricting plate that leads shaft 60 in one direction. The restricting plate opens the guide hole when pushed from below. Shaft 60 is moved in the front-rear direction from a retreated position to a hooking position, and when shaft 60 enters from below, the restricting plate opens and can move shaft 60 to the retreated position. In loading/unloading section 47B, as hooking member 48B is hooked to the exchange target object and driving section 49B moves hooking member 48B along the guide of guide member 59, the exchange target object can be pulled into storage section 42 or can be pushed from storage section 42. When placement section 50 is being lifted and lowered, loading/unloading section 47B is flipped up as a whole in a vertical state from a horizontal state (FIG. 10), such that the movement of placement section 50 is not hindered.

Alternatively, the loading/unloading section that pulls in and pushes out an exchange target object is not limited to a section including holding member 48 and loading/unloading roller 49. For example, the loading/unloading section may have at least one pair of the holding members for holding an end portion of the exchange target object disposed outside storage device 40 and at least one pair of the linear motion driving sections that moves the exchange target object in the loading/unloading direction together with holding member (see FIG. 9). In the storage device, the exchange target object can be held by the holding member, and the exchange target object can be pulled into the storage section or can be pushed from the storage section by the linear motion driving section. As shown in FIG. 9, storage device 40 may share the target object moving section and the loading/unloading section, or the target object moving section and the loading/unloading section may be provided separately.

Although printing device 11 has mask moving section 27 in the embodiment described above, printing device 11 need not have mask moving section 27. In this case, storage device 40 need only have loading/unloading section 47 which is also provided on the printing device 11 side. In addition, although automated guided vehicle 14 does not have a configuration of pulling in and pushing out an exchange target object, automated guided vehicle 14 may have the configuration. In this case, loading/unloading section 47 may be omitted in storage device 40.

An exchange target object is screen mask M in the embodiment described above; however, the exchange target object is not limited to this insofar as exchange is required, and may be cartridge 35 accommodating viscous fluid, squeegee 25, cleaning member 33 used in cleaning screen mask M, and the support member that fixes a printing target, in addition to screen mask M. In addition, the printing target is board S; however, the printing target is not particularly limited to this insofar as viscous fluid is printed, and may be a three-dimensional object. In addition, the viscous fluid is solder paste, but may be conductive paste or adhesive.

Target object moving section 44 is disposed on the side surface side of an exchange target object and the side surface is moved while being gripped in the embodiment described above; however, the configuration is not limited to this. For example, target object moving section 44 may move the exchange target object by gripping upper and lower surfaces thereof.

Support roller 51 is disposed only in the end portion region of screen mask M and there is the support shaft in another region in the embodiment described above; however, without being particularly limited to this, the support roller may be provided at the entire support shaft. In addition, placement section 50 includes support roller 51 and plate 52; however, without being particularly limited to this, any one of the support roller and the plate may be omitted. Even when placement section 50 has a placement surface, the movement of screen mask M can be performed.

Door section 53 whose shielding plate 54 moves up and down is included in the embodiment described above; however, without being particularly limited to this, shielding plate 54 may move right and left. In addition, storage device 40 includes door section 53, but door section 53 may be omitted. In a case of omitting door section 53, storage device 40 may have support roller 51 provided with a lock mechanism, or support roller 51 may be omitted.

INDUSTRIAL APPLICABILITY

The present disclosure is applicable to the technical field of devices for performing a component mounting process.

REFERENCE SIGNS LIST 10 mounting system, 11 printing device, 12 printing system, 13 mounting device, 14 automated guided vehicle, 16 opening section, 17 loading/unloading port, 18 management PC, 21 control section, 22 printing section, 23 printing head, 24 printing moving section, 25 squeegee, 26 mask operation section, 27 mask moving section, 28 mask fixing section, 30 board processing section, 31 board conveyance section, 32 cleaning section, 33 cleaning member, 34 supply section, 35 cartridge, 40, 40B, 40C storage device, 41 control section, 42 storage section, 43 placement section moving section, 44, 44B, 44C target object moving section, 45, 45B, 45C gripping member, 46, 46B conveyance roller, 46C linear motion driving section, 47, 47B loading/unloading section, 48 holding member, 48B hooking member, 49 loading/unloading roller, 49B driving section, 50 placement section, 51 support roller, 52 plate, 53 door section, 54 shielding plate, 55 opening and closing driving section, 56 retraction driving section, 57 conveyance driving section, 58 transfer stage, 59 guide member, 60 shaft, E end portion region, M screen mask, S board.

The invention claimed is:

1. A storage device of a printing device including a printing section configured to perform a viscous fluid printing process on a printing target using an exchange target object including a screen mask, the storage device comprising:

a storage section having a transfer stage for loading and unloading the exchange target object to and from the printing section, the storage section being configured to accommodate multiple placement sections for placing the exchange target object, and to store the exchange target object;

a placement section moving section configured to move any one of the placement sections to the transfer stage; and a target object moving section disposed on the transfer stage, the target object moving section being configured to move between a retracted position allowing the placement section to pass and an abutting position abutting against the exchange target object on the placement section and includes at least one pair of gripping members to move the exchange target object in a loading/unloading direction while abutting against the exchange target object at the abutting position; and a loading/unloading section being stored in the storage section and being disposed on the transfer stage, the loading/unloading section being configured to pull the exchange target object into the storage section or to push the exchange target object out of the storage section by protruding outward from the storage section.

2. The storage device according to claim 1,
wherein the at least one pair of gripping members configured to move between the retracted position and the abutting position and to grip an end portion of the exchange target object and at least one pair of conveyance rollers configured to move together with the at least one pair of gripping members and to move the exchange target object in the loading/unloading direction.

3. The storage device according to claim 2,
wherein the at least one pair of gripping members are each a belt being configured to be wound around a conveyance roller of the at least one pair of conveyance rollers to be driven by the conveyance roller, and to abut against the exchange target object.

4. The storage device according to claim 1,
wherein in a placement section of the placement sections, multiple support rollers supporting at least an end portion of the exchange target object are disposed.

5. The storage device according to claim 1, further comprising:
a door section configured to move between a restricted position where movement of the exchange target object on the transfer stage in the loading/unloading direction is restricted and an open position where movement of the exchange target object in the loading/unloading direction is allowed.

6. The storage device according to according to claim 1,
wherein the loading/unloading section has at least one pair of holding members configured to hold an end portion of the exchange target object disposed outside the storage device and at least one pair of loading/unloading rollers configured to move together with a holding member of the at least one pair of holding members and to move the exchange target object in the loading/unloading direction.

7. The storage device according to claim 1,
wherein the loading/unloading section has at least one pair of holding members configured to hold an end portion of the exchange target object disposed outside the storage device and at least one pair of linear motion driving sections configured to move the exchange target object in the loading/unloading direction together with holding member.

8. The storage device according to claim 1,
wherein the loading/unloading section has a hooking member configured to hook an end portion of the exchange target object disposed outside the storage device and to move the exchange target object in the loading/unloading direction, a guide member configured to guide the hooking member between a protruding position, protruding to an outside of the storage device, and a retreated position inside the storage device, and a driving section configured to move the hooking member along the guide member.

9. A printing system comprising:
the storage device according to claim 1; and
a printing device including a printing section configured to perform a viscous fluid printing process on a printing target using an exchange target object including a screen mask pushed from the storage device.

10. A storage device of a printing device including a printing section configured to perform a viscous fluid printing process on a printing target using an exchange target object including a screen mask, the storage device comprising:

a storage section having a transfer stage for loading and unloading the exchange target object to and from the printing section, the storage section being configured to accommodate multiple placement sections for placing the exchange target object, and to store the exchange target object;

a placement section moving section configured to move any one of the placement sections to the transfer stage; and a target object moving section disposed on the transfer stage, the target object moving section being configured to move between a retracted position allowing the placement section to pass and an abutting position abutting against the exchange target object on the placement section and to move the exchange target object in a loading/unloading direction while abutting against the exchange target object at the abutting position, wherein the target object moving section includes at least one pair of gripping members configured to move between the retracted position and the abutting position and to grip an end portion of the exchange target object and at least one pair of linear motion driving sections configured to move the exchange target object in the loading/unloading direction together with gripping member.

* * * * *